(12) United States Patent
Zhan et al.

(10) Patent No.: US 7,539,471 B2
(45) Date of Patent: May 26, 2009

(54) METHOD AND APPARATUS TO PROVIDE VARIABLE GAIN IN A RADIO RECEIVER FRONT END

(75) Inventors: Jing-Hong C Zhan, Hillsboro, OR (US); Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 11/394,798

(22) Filed: Mar. 30, 2006

(65) Prior Publication Data

US 2007/0238431 A1 Oct. 11, 2007

(51) Int. Cl.
*H04B 1/18* (2006.01)
*H04B 1/28* (2006.01)

(52) U.S. Cl. .................... 455/130; 455/232.1; 455/293; 455/333

(58) Field of Classification Search ................ 455/136, 455/138, 232.1–251.1, 293, 323–326, 333; 375/345

See application file for complete search history.

(56) References Cited

U.S. PATENT DOCUMENTS

| | | | |
|---|---|---|---|
| 6,298,221 B1 * | 10/2001 | Nguyen ....................... 455/73 |
| 6,498,926 B1 * | 12/2002 | Ciccarelli et al. ........ 455/240.1 |
| 6,509,777 B2 | 1/2003 | Razavi et al. |
| 6,807,406 B1 * | 10/2004 | Razavi et al. ................ 455/313 |
| 6,999,012 B2 | 2/2006 | Kim et al. |
| 7,386,075 B2 * | 6/2008 | Mostov et al. ............... 375/345 |
| 2003/0025623 A1 * | 2/2003 | Brueske et al. .............. 341/139 |
| 2004/0248536 A1 * | 12/2004 | Sato et al. ................. 455/232.1 |
| 2005/0208919 A1 * | 9/2005 | Walker et al. ............... 455/296 |
| 2006/0040617 A1 * | 2/2006 | Haub et al. ............... 455/67.13 |
| 2006/0135104 A1 * | 6/2006 | Lee et al. .................. 455/234.1 |

FOREIGN PATENT DOCUMENTS

JP 2002-016462 1/1990
WO WO-2004113949 A1 12/2004

OTHER PUBLICATIONS

"International Search Report and Written Opinion received", PCT/US2007/064737 (Aug. 2, 2007), 1-13.

* cited by examiner

*Primary Examiner*—Simon D Nguyen
(74) *Attorney, Agent, or Firm*—The Law Offices of John C. Scott, LLC; John C. Scott

(57) ABSTRACT

An RF receiver front end includes a variable gain low noise amplifier and/or a variable gain mixer to provide gain variability in the receiver. This gain variability may be used during, for example, automatic gain control operations. In at least one embodiment, the variable gain LNA is a broadband device that is capable of supporting multiple wireless standards.

24 Claims, 3 Drawing Sheets

METHOD AND APPARATUS TO PROVIDE VARIABLE GAIN IN A RADIO RECEIVER FRONT END

TECHNICAL FIELD

The invention relates generally to radio frequency (RF) receivers and, more particularly, to techniques for providing variable gain within an RF receiver.

BACKGROUND OF THE INVENTION

Radio frequency (RF) receivers are often called upon to receive signals having a wide range of different signals strengths. In some instances, such as when a receiver is far from a corresponding transmitter, a received signal may have a very low signal strength. In other instances, such as when the receiver is close to the transmitter, signals having a relatively high signal strength may be received. These stronger receive signals can overload a receiver front end, causing it to saturate and generate distortion. Stronger receive signals may also cause the receiver front end to output a signal that is too large for the subsequent circuitry to reliably process. For these reasons, gain control techniques have been developed for automatically adjusting the gain of a receiver front end based on one or more measured quantities (e.g., received signal level, etc.). As can be appreciated, gain control techniques require some form of controllable gain within a receiver front end. There is a need for techniques for efficiently providing such gain controllability.

DETAILED DESCRIPTION

Figure 1:
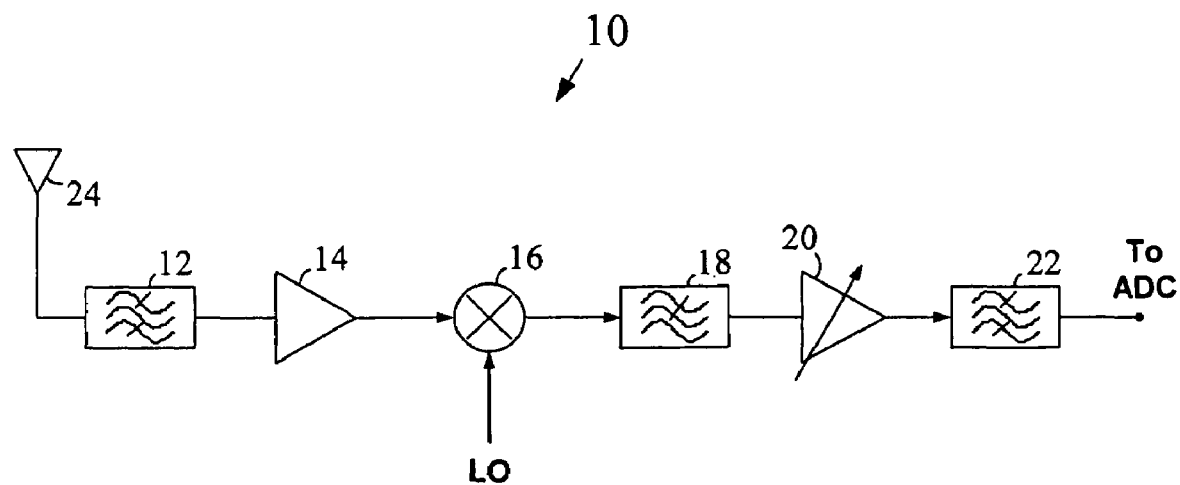
FIG. 1 is a block diagram illustrating a conventional receiver front end architecture that may be used within a radio frequency (RF) receiver.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating a conventional receiver front end architecture 10 that may be used within a radio frequency (RF) receiver. As shown, the architecture 10 includes: a preselector 12, a low noise amplifier (LNA) 14, a mixer 16, a first baseband filter 18, a variable gain amplifier (VGA) 20, and a second baseband filter 22. One or more antennas 24 may be coupled to the receiver to facilitate the reception of signals from the wireless channel. Any type of antenna(s) may be used including, for example, a dipole, a patch, a helical antenna, an antenna array, and/or others. The preselector 12 is a band pass filter that filters the signal received from the wireless channel to limit the received energy to a predetermined frequency range. The LNA 14 then amplifies the signal in a low noise manner. The mixer 16 downconverts the received signal from an RF carrier frequency to baseband. The first baseband filter 18 filters the output of the mixer 16 to suppress any spurious frequency components within the signal that are above a predetermined cutoff frequency. The first baseband filter 18 may remove, for example, undesired frequency components resulting from nonlinearities in the mixer 16 or the LNA 14 (e.g., harmonics, intermodulation products, etc.).

The VGA 20 amplifies the output of the first baseband filter 18. The second baseband filter 22 then filters the output of the VGA 20 to suppress any spurious frequency components within that signal that are outside a frequency band of interest. The baseband output signal of the second baseband filter 22 may then be delivered to an analog to digital converter (ADC) to be digitized. The resulting digital signal can then be processed in a digital processing device (e.g., a digital signal processor (DSP), etc.) to recover the content of the received signal. The VGA 20 has a gain that can be varied in a controlled manner. This gain variability may be used, for example, to provide automatic gain control for the receiver front end 10. Thus, when a relatively large signal is received at the antenna 24, the gain of the VGA 20 can be reduced so that the output signal of the receiver front end 10 does not overdrive the ADC.

Figure 2:
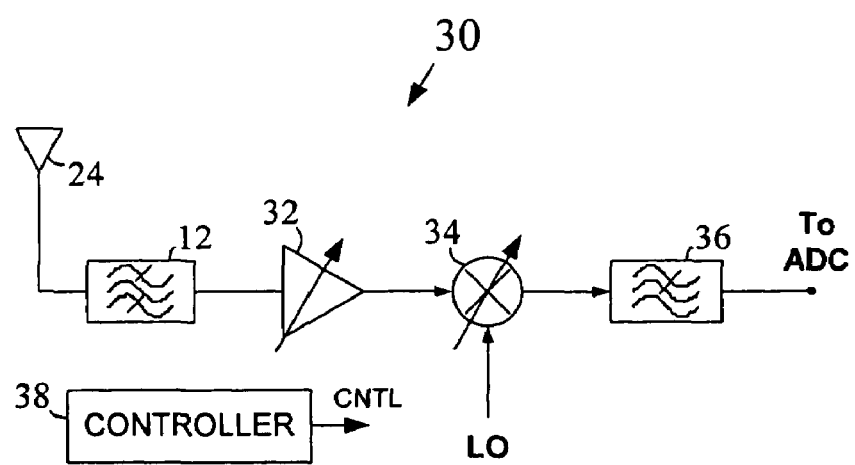
FIG. 2 is a block diagram illustrating an example receiver front end architecture in accordance with an embodiment of the present invention.

FIG. 2 is a block diagram illustrating an example receiver front end architecture 30 in accordance with an embodiment of the present invention. As shown, the front end 30 includes: a preselector 12, a variable gain LNA 32, a variable gain mixer 34, and a baseband filter 36. The front end 30 may also include, or be in communication with, a controller 38 to provide control signals to the variable gain LNA 32 and the variable gain mixer 34 during receiver operation. Acting together, the variable gain LNA 32 and the variable gain mixer 34 can generate a number of different gain levels for the receiver front end 30 to allow gain adjustments to be made. The number of gain levels that the variable gain LNA 32 and the variable gain mixer 34 are capable supporting may vary from implementation to implementation based on, for example, the requirements of a standard or specification of interest. When adequate gain variability is available from the variable gain LNA 32 and the variable gain mixer 34, a VGA and filter (e.g., VGA 20 and filter 22 of FIG. 1) may not be needed after the baseband filter 36 (although these structures may be present in some embodiments of the invention). In at least one embodiment, a variable gain LNA 32 is used that does not include any chip inductors. The lack of chip inductors along with the lack of a VGA and associated filter allow a receiver front end to be produced that is relatively compact on a semiconductor chip. As will be appreciated, it is usually desirable to generate integrated circuits that use as little chip surface area as possible.

In at least one embodiment, the variable gain LNA 32 is a broadband device that is capable of supporting multiple different wireless standards. In such an embodiment, an RF receiver including the front end 30 may be used within a multi-standard communication device that is operative within multiple different systems. For example, a communication device may be capable of communicating in both an IEEE 802.11a (5 GHz) network and an IEEE 802.11b/g (2.4 GHz) network.

In addition to the benefits described above, the front end architecture 30 of FIG. 2 is capable of providing additional power savings over the conventional architecture of FIG. 1. As is well known, amplifier operation typically requires more power at higher frequencies than at lower frequencies. In the receiver front end 10 of FIG. 1, the VGA 20 operates at baseband frequencies and, therefore, requires less power to operate than amplifiers that operate at higher RF frequencies. Thus, when the VGA 20 is operated at a lower gain level, the amount of power that can be saved within the circuit is limited. In the receiver front end 30 of FIG. 2, on the other hand, the variable gain LNA 32 operates at RF frequencies. Therefore, when the amplifier 32 is operated in low gain (low current) mode, a significantly greater level of power saving may be achieved. As lower gain operation often predominates in receiver front ends, the architecture 30 of FIG. 2 can provide a significant power saving advantage over previous systems.

Figure 3:
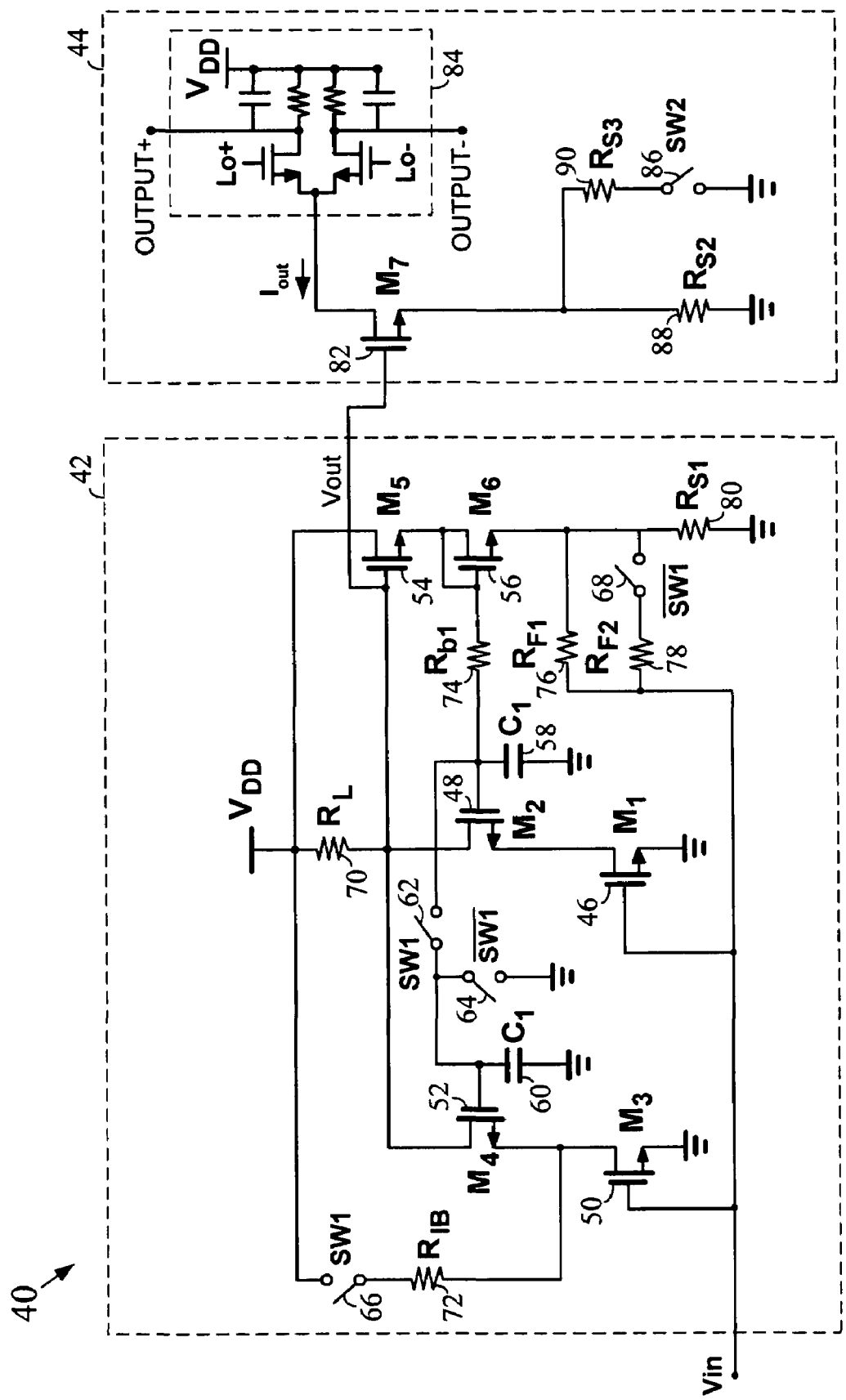
FIG. 3 is a schematic diagram illustrating example circuitry that may be used within an RF receiver front end in accordance with an embodiment of the present invention.

FIG. 3 is a schematic diagram illustrating example circuitry 40 that may be used within an RF receiver front end in accordance with an embodiment of the invention. As illustrated, the circuitry 40 includes variable gain LNA circuitry 42 and variable gain mixer circuitry 44. The circuitry 40 may be used within the receiver front end 30 of FIG. 2 or within other RF receiver architectures. The variable gain LNA circuitry 42 is capable of broadband operation and operation within multiple different standards. In at least one implementation, an operational bandwidth of approximately 6 GHz is achieved. In addition, the variable gain LNA circuitry 42 does not require the use of chip inductors, which are often present in broadband designs.

The variable gain mixer 44 achieves gain variability by providing means for modifying the output current of a transconductor portion of the mixer circuitry. By including some of the gain variation of the circuitry 40 within the mixer 44, less switches need to be used within the LNA circuitry 42 to provide a desired level of gain variability, thereby simplifying the design of the LNA and improving the performance thereof. In the illustrated embodiment, the variable gain LNA circuitry 42 has two different gain states, as does the variable gain mixer 44. This results in 4 independent gain states for the circuitry 40. As will be described in greater detail, modifications may be made to the circuitry 40 to provide additional gain states when required for a particular implementation. The circuitry 40 of FIG. 3 may be implemented using complementary metal oxide semiconductor (CMOS) technology or other semiconductor techniques.

In the embodiment of FIG. 3, the variable gain LNA 42 includes: first, second, third, fourth, fifth, and sixth transistors 46, 48, 50, 52, 54, 56 ($M_1$, $M_2$, $M_3$, $M_4$, $M_5$, $M_6$); first and second capacitors 58, 60; first, second, third, and fourth switches 62, 64, 66, 68; a load resistor 70 ($R_L$); first, second, and third bias resistors 72, 74, 80 ($R_{IB}$, $R_{b1}$, $R_{S1}$); and first and second feedback/matching resistors 76, 78 ($R_{F1}$, $R_{F2}$). The first and second transistors $M_1$, $M_2$ form a first cascode pair within the LNA 42 for amplifying an input signal $V_{in}$. As is well known, a cascode arrangement of transistors typically has a high output impedance and low reverse gain. As shown, a gate terminal of the first transistor 46 is coupled to receive $V_{in}$. The source terminal of the first transistor 46 is coupled to ground. The source terminal of the second transistor 48 is coupled to the drain terminal of the first transistor 46. The drain terminal of the second transistor 48 is coupled to supply terminal $V_{DD}$ through load resistor 70. The output signal of the LNA 42 develops at the node connecting the drain terminal of the second resistor 48 to the load resistor 70. First capacitor 58 is connected between the gate terminal of the second transistor 48 and a ground terminal to provide a relatively low impedance at RF frequencies (e.g., an RF short circuit) but a high impedance at DC (e.g., an open circuit).

The third and fourth transistors $M_3$, $M_4$ form a second cascode pair within the LNA 42. The second cascode pair is connected in a similar manner to the first cascode pair. The drain terminal of the fourth transistor 52 is coupled to the drain terminal of the second transistor 48 (and the load resistor 70) which carries the output signal of the LNA 42. The second capacitor 60 is connected between the gate terminal of the fourth transistor 52 and the ground terminal to provide a relatively small impedance at RF frequencies. The first bias resistor 72 is connected between the supply terminal $V_{DD}$ and the drain terminal of the third transistor 50 to provide additional current to the third transistor 50 during amplification activity to increase the transconductance ($g_{m,M3}$) of the transistor without a headroom penalty.

The first, second, and third switches 62, 64, 66 are used to controllably activate and deactivate the second cascode pair ($M_3$, $M_4$) within the LNA circuit 42. When the second cascode pair in activated, the LNA circuit 42 operates in a high gain state. When the second cascode pair is deactivated, the LNA circuit 42 operates in a low gain state. To achieve the high gain state, the control signal SW1 is set to logic high. This causes switch 64 to open, which disconnects the gate terminal of the fourth transistor 52 from ground. The control signal also causes the switch 62 to close, thus coupling the gate terminal of the second transistor 48 (and the corresponding bias voltage) to the gate terminal of the fourth transistor 52. The control signal further causes switch 66 to close, which connects the supply terminal $V_{DD}$ to the bias resistor 72 to provide additional current to the third transistor 50 as described above. When in the high gain state, the open loop voltage gain of the LNA circuit 42 is roughly ($g_{m,M1}$+$g_{m,M3}$)$R_L$, where $g_{m,M1}$ and $g_{m,M3}$ are the transconductances of the first and third transistors 46, 50, respectively.

To achieve the low gain state, the control signal SW1 is set to logic low. This causes switch 64 to close, thus coupling the gate terminal of the fourth transistor 52 to ground. The control signal also opens switch 62, which decouples the gate terminal of the fourth transistor 52 from the gate terminal of the second transistor 48 (and the corresponding bias voltage). In addition, the control signal further causes switch 66 to open, which terminates all current flow through the first bias resistor 72 ($R_{IB}$). This effectively turns off the third and fourth transistors 50, 52, which saves power. When in the low gain state, the open loop voltage gain of the LNA circuit 42 is roughly $g_{m,M1}R_L$. The fifth and sixth transistors 54, 56 provide an RF feedback path within the LNA circuit 42 for bandwidth improvement and input matching purposes. The fifth and sixth transistors 54, 56 also provide a DC feedback path to provide a gate bias to the second transistor 48 and sometimes the fourth transistor 52. The drain current through the fifth and sixth transistors 54, 56 generates a voltage drop across the third bias resistor 80 which translates to the gate terminal of the second transistor 48, via second resistor 74, as a bias voltage. The first and second feedback/matching resistors 76, 78 ($R_{F1}$, $R_{F2}$) are used to provide resistive feedback in the circuitry 42 to enhance bandwidth and also for input matching purposes. When the LNA circuit 42 is switched to the low gain state, the feedback impedance needs to be lowered to maintain a good input match. In the illustrated embodiment, this is achieved by closing switch 68 which places the second feedback/matching resistor 78 in parallel with the first feedback/matching resistor 76, thus reducing the feedback resistance. The input impedance of the variable gain LNA circuit 42 in the low gain state is approximately $(R_{F1}||R_{F2})/A_V(\text{low})$, where $A_V(\text{low})$ is the voltage gain in the low gain state and $R_{F1}||R_{F2}$ is the parallel combination of the two resistances. In the high gain state, the input impedance is approximately $R_{F1}/A_V(\text{high})$, where $A_V(\text{high})$ is the voltage gain in the high gain state.

The variable gain LNA 42 of FIG. 3 may be modified to achieve additional gain levels. For example, in at least one embodiment, a third pair of cascode connected transistors is included in the LNA circuit with corresponding switches (e.g., like switches 62, 64) to couple and decouple the cascade arrangement into and out of the circuit. A switch and resistor like switch 66 and resistor 72 of FIG. 3 may (or may not) be provided for the third pair of cascade connected transistors. Further pairs of cascode connected transistors may also be added to achieve additional gain levels if the underlying semiconductor technology permits.

Referring again to FIG. 3, the variable gain mixer 44 of the illustrated embodiment includes: a transconductor transistor 82, a mixer core 84, a switch 86, and first and second resistors 88, 90 ($R_{S2}$, $R_{S3}$). The mixer core 84 is a conventional single balanced transistor mixer circuit, where a balanced local oscillator (LO) signal is applied to the LO+ and LO− terminals and a downconverted output signal develops across the OUTPUT+ and OUTPUT− terminals. The transconductor 82 draws a current $I_{out}$ through the mixer core 84 and down through one or both of the resistors 88, 90. Gain variation is achieved by switching the second transistor 90 into or out of the circuit using switch 86. To achieve a high gain state, the switch 86 is closed. This results in less resistance between transconductor 82 and ground and the current through the mixer core 84 increases. The resulting small signal transconductance of transconductor 82 is approximately $1(R_{S2}||R_{S3})$. To achieve a low gain state, the switch 86 is opened. This results in greater resistance between transconductor 82 and ground and the current through the mixer core 84 decreases. The resulting small signal transconductance of transconductor 82 under these circumstances is approximately $1/R_{S2}$. Additional gain states may be achieved by, for example, adding more parallel resistances with corresponding switches to the mixer circuit 44. Other techniques for providing a controllable resistance between the transconductor 82 and ground may alternatively be used. As described previously, the overall number of gain states provided within a receiver front end will typically be implementation specific.

As described above, in the illustrated embodiment, the mixer core 84 is a single balanced transistor mixer circuit. It should be appreciated that other types of mixer cores may alternatively be used (e.g., double balanced transistor mixer cores, diode based mixer cores, etc.).

The switches within the LNA circuit 42 of FIG. 3 may be more difficult to implement than the switches within the mixer 44. This is because some or all of the switches in the LNA 42 may require a low "on" resistance (e.g., switches 62 and 64), while the switches in the mixer do not. A low "on" resistance is typically achieved by using a larger device. However, larger devices usually have larger parasitic capacitances, which can have a negative impact on RF performance. Because low "on" resistance is not a concern in the mixer, smaller devices may be used. In addition, the low noise amplification performed in the LNA 42 makes noise within the switches of the mixer 44 less damaging to overall noise performance in the receiver front end. For these reasons, it may be desirable to add additional gain states, if needed, within the mixer than within the LNA.

The front end circuitry 40 of FIG. 3 is single ended circuitry. A differential version of the circuitry can be achieved by simply mirroring the variable gain LNA circuit 42 and the transconductor 82, resistors 88, 90 and switch 86 of the mixer 44, and taking the differential output currents to the mixer (e.g., a double balanced mixer, etc.). The inputs of the two LNA circuits would then serve as the differential input of the front end circuitry.

In the illustrated embodiment, metal oxide semiconductor field effect transistors (MOSFETs) are used within the variable gain LNA 42 and the mixer 44 of FIG. 3. In other embodiments, other transistor types, or combinations of transistor types, may be used (e.g., bipolar junction transistors, junction FETs, and/or others). It should be appreciated that the circuitry 40 of FIG. 3 represents one circuit topology that may be used within the receiver front end 30 of FIG. 2. Other circuit arrangements may alternatively be used.

Figure 4:
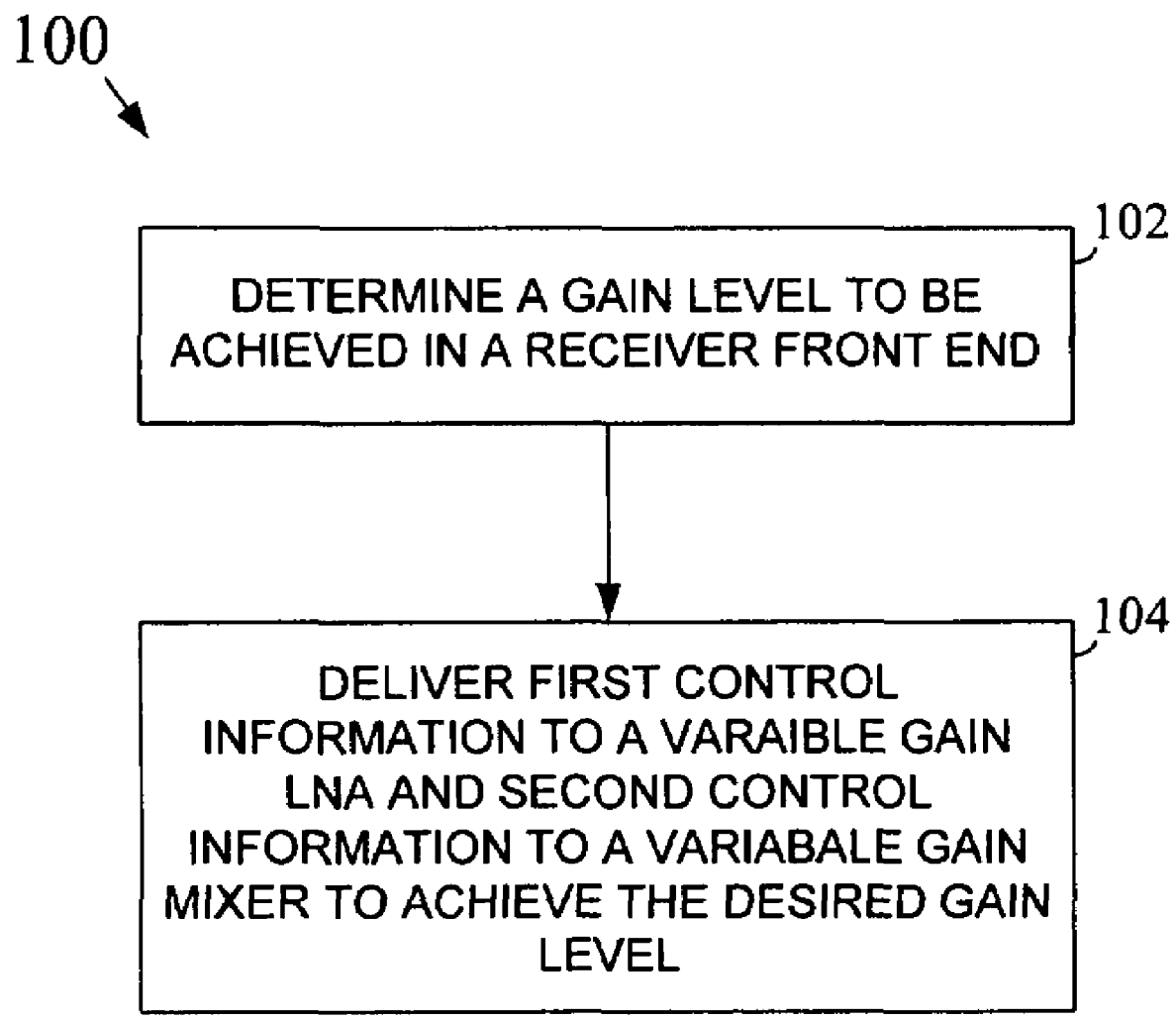
FIG. 4 is a flowchart illustrating an example method for use in operating an RF receiver in accordance with an embodiment of the present invention.

The receiver front end architecture 30 illustrated in FIG. 2 is a direct conversion receiver that directly converts the received signal from RF to baseband using a single downconversion. It should be appreciated that features of the present invention may also be implemented in other types of receivers including, for example, super-heterodyne receivers that include one or more intermediate frequency (IF) stages. Super-heterodyne receivers typically include multiple mixers in the receiver chain. In at least one embodiment of the invention, two or more mixers within a single receiver chain have variable gain. FIG. 4 is a flowchart illustrating an example method 100 for use in operating an RF receiver in accordance with an embodiment of the present invention. The method 100 may be implemented within, for example, a digital processing device associated with the RF receiver (e.g., within controller 38 of FIG. 2). The digital processing device may include, for example, a general purpose microprocessor, a digital signal processor (DSP), a reduced instruction set computer (RISC), a complex instruction set computer (CISC), a field programmable gate array (FPGA), an application specific integrated circuit (ASIC), a microcontroller, and/or others, including combinations of the above. As shown in FIG. 4, a desired gain level is first identified for a receiver front end (block 102). This gain level may be determined during, for example, an automatic gain control (AGC) operation. In one approach, a parameter level (e.g., a receive signal strength, etc.) may first be measured within the receiver and a gain level selected from a plurality of available levels based on the measured parameter. The gain level may be selected to, for example, maintain a desired signal level range at the output of the receiver front end. Other techniques for determining a gain level may alternatively be used.

Once a gain level has been determined, first control information is delivered to a variable gain LNA within the receiver front end and second control information is delivered to a variable gain mixer within the receiver front end to achieve the desired gain level (block 104). The first control information may include, for example, information for controlling one or more switches (e.g., switches 62, 64, 66 in FIG. 3, etc.) within the variable gain LNA that operate to couple or decouple one or more amplification sub-circuits (e.g., a transistor cascode arrangement, etc.) into or out of the LNA circuitry.

The first control information may also include, for example, information for controlling one or more switches that set a level of feedback resistance within the variable gain LNA in a manner that adjusts an input impedance of the LNA circuitry. The second control information may include, for example, information for controlling one or more switches (e.g., switch 86 in FIG. 3, etc.) within the variable gain mixer that operate to modify a resistance level between a transconductor (e.g., transconductor 82 in FIG. 3, etc.) and a ground terminal within a transconductance mixer arrangement. Other types of control information may alternatively be used. If a receiver includes multiple variable gain mixers, then control information may also be delivered to the other mixers in method 100. Likewise, if there is one or more VGAs within the receiver in addition to the variable gain LNA and the variable gain mixer, control information may also be delivered to the VGA(s). The method 100 may be performed repeatedly during operation of a wireless receiver system (e.g., at periodic intervals, at the initiation of communication connections, at predetermined times, etc.).

In at least one embodiment, the control information is stored within a memory associated with the RF receiver. The memory may include, for example, an entry for each gain level that a receiver front end is capable of assuming. When it is determined that a particular gain level is to be used, the information is retrieved from the corresponding memory location and is delivered to the appropriate components within the receiver front end. Other techniques for obtaining the control information for use in the method 100 of FIG. 4 may alternatively be used.

The techniques and structures of the present invention may be implemented in any of a variety of different forms. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data. As is well known, the drain and source terminals of a FET device are often interchangeable. For this reason, a FET may be described herein as having two drain/source terminals rather than a drain terminal and a source terminal.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A wireless receiver comprising:
   a low noise amplifier (LNA) having a controllable gain to amplify a receive signal; and
   a mixer having a controllable gain to perform a frequency conversion on a signal output from said LNA;
   wherein said LNA includes:
      first and second transistors connected in a cascode arrangement, wherein a first drain/source terminal of said second transistor is connected to an output node of said LNA;
      third and fourth transistors connected in a cascode arrangement, wherein a first drain/source terminal of said fourth transistor is connected to said output node of said LNA; and
      a first switch to controllably couple a gate terminal of said second transistor to a gate terminal of said fourth transistor.

2. The wireless receiver of claim 1, wherein:
   said LNA has an operational bandwidth that is wide enough to support multiple wireless standards, said multiple wireless standards including at least a first wireless standard and a second wireless standard, wherein a frequency range associated with said first wireless standard is not coextensive with a frequency range associated with said second wireless standard.

3. The wireless receiver of claim 1, wherein:
   said LNA does not include any chip inductors.

4. The wireless receiver of claim 1, wherein:
   a gate terminal of said. first transistor and a gate terminal of said third transistor are coupled to receive an input signal of said LNA.

5. The wireless receiver of claim 1, wherein said LNA further includes:
   a second switch to controllably couple said gate terminal of said fourth transistor to ground.

6. The wireless receiver of claim 5, wherein said LNA further includes:
   a third switch to controllably couple a supply node to a first source/drain terminal of said third transistor through a first resistor.

7. The wireless receiver of claim 6, wherein said LNA further includes:
   a fourth switch to controllably modify a feedback resistance within said LNA to maintain a desired input resistance for the LNA as a gain level changes.

8. The wireless receiver of claim 7, wherein said LNA further includes:
   fifth and sixth transistors for use in providing (a) resistive feedback in said LNA and (b) a bias voltage to said gate terminal of said second transistor.

9. The wireless receiver of claim 1, wherein said mixer includes:
   a mixer core;
   a transconductor transistor to draw a current through said mixer core; and
   a controllable resistance between said transconductor transistor and a ground terminal.

10. The wireless receiver of claim 9, wherein:
said controllable resistance includes a switch to controllably couple one resistance in parallel with another resistance.

11. A communication device comprising:
at least one dipole antenna;
a low noise amplifier (LNA) having a controllable gain to amplify a receive signal received by said at least one dipole antenna; and
a mixer having a controllable gain to perform a frequency conversion on a signal output from said LNA;
wherein said mixer includes:
  a mixer core;
  a transconductor transistor to draw a current through said mixer core; and
  a controllable resistance between said transconductor transistor and a ground terminal, said controllable resistance including a switch to controllably couple one resistance in parallel with another resistance.

12. The communication device of claim 11, further comprising:
a controller to deliver control signals to said LNA and said mixer to set gain levels thereof.

13. The communication device of claim 11, wherein said LNA includes:
first and second transistors connected in a cascode arrangement, wherein a first drain/source terminal of said second transistor is connected to an output node of said LNA;
third and fourth transistors connected in a cascode arrangement, wherein a first drain/source terminal of said fourth transistor is connected to said output node of said LNA; and
a first switch to controllably couple a gate terminal of said second transistor to a gate terminal of said fourth transistor.

14. A computer implemented method comprising:
determining a gain level to be used by a receiver front end; and
delivering first control information to a variable gain LNA within said receiver front end and second control information to a variable gain mixer within said receiver front end, said first control information and said second control information being selected to achieve said gain level in said receiver front end;
wherein said variable gain LNA includes:
  first and second transistors connected in a cascode arrangement, wherein a first drain/source terminal of said second transistor is connected to an output node of said LNA;
  third and fourth transistors connected in a cascode arrangement, wherein a first drain/source terminal of said fourth transistor is connected to said output node of said LNA; and
  a first switch to controllably couple a gate terminal of said second transistor to a gate terminal of said fourth transistor, wherein said first control information includes control data to control a state of said first switch.

15. The method of claim 14, wherein:
said gain level is determined as part of an automatic gain control operation.

16. The method of claim 14, wherein:
said first control information includes information to control one or more switches in said variable gain LNA to controllably couple or decouple an amplification sub-circuit into or out of an operational configuration within said LNA.

17. The method of claim 14, wherein:
said first control information includes information to control one or more switches that set a level of feedback resistance within said variable gain LNA.

18. The method of claim 14, wherein:
said second control information includes information to control one or more switches within said variable gain mixer to set a resistance level between a transconductor and a common terminal within said mixer.

19. The method of claim 14, wherein:
said variable gain mixer is a first variable gain mixer within said receiver front end; and
said method further comprises:
  delivering third control information to a second variable gain mixer within said receiver front end, said third control information being selected to achieve said gain level in said receiver front end in conjunction with said first and second control information.

20. The method of claim 14, further comprising:
performing determining and delivering repeatedly during operation of said receiver front end.

21. An article comprising a computer readable storage medium having instructions stored thereon that, when executed by a computing platform, operate to:
determine a gain level to be used by a receiver front end; and
deliver first control information to a variable gain LNA within said receiver front end and second control information to a variable gain mixer within said receiver front end, said first control information and said second control information being selected to achieve said gain level in said receiver front ends;
wherein said variable gain mixer includes:
  a mixer core;
  a transconductor transistor to draw a current through said mixer core; and
  a controllable resistance between said transconductor transistor and a ground terminal, said controllable resistance including a switch to controllably couple one resistance in parallel with another resistance, wherein said second control information includes control data to control a state of said switch.

22. The article of claim 21, wherein:
said first control information includes information to control one or more switches in said variable gain LNA to controllably couple or decouple an amplification sub-circuit into or out of an operational configuration within said LNA.

23. The article of claim 21, wherein:
said first control information includes information to control one or more switches that set a level of feedback resistance within said variable gain LNA.

24. The article of claim 21, wherein:
said second control information includes information to control one or more switches within said variable gain mixer to set a resistance level between a transconductor and a ground terminal within said mixer.

* * * * *